(12) United States Patent
Chang et al.

(10) Patent No.: US 9,674,941 B2
(45) Date of Patent: Jun. 6, 2017

(54) PRINTED CIRCUIT BOARD FOR MOBILE PLATFORMS

(71) Applicant: MediaTek Inc., Hsin-Chu (TW)

(72) Inventors: Sheng-Ming Chang, New Tapei (TW); Shih-Chieh Lin, Taipei (TW); Nan-Cheng Chen, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/816,204

(22) Filed: Aug. 3, 2015

(65) Prior Publication Data

US 2015/0342038 A1 Nov. 26, 2015

Related U.S. Application Data

(63) Continuation of application No. 13/747,738, filed on Jan. 23, 2013, now Pat. No. 9,131,602.
(Continued)

(51) Int. Cl.
*H05K 1/00* (2006.01)
*H05K 1/02* (2006.01)
*H05K 1/11* (2006.01)

(52) U.S. Cl.
CPC .......... *H05K 1/0219* (2013.01); *H05K 1/025* (2013.01); *H05K 1/0218* (2013.01);
(Continued)

(58) Field of Classification Search
CPC ... H05K 1/00; H05K 1/02; H05K 1/11; H05K 1/16; H05K 1/028; H05K 1/112;
(Continued)

(56) References Cited

U.S. PATENT DOCUMENTS

| 4,798,918 | A | | 1/1989 | Kabadi et al. |
| 5,408,053 | A | * | 4/1995 | Young ............... H01P 3/088 174/262 |

(Continued)

FOREIGN PATENT DOCUMENTS

| CN | 1427662 | 7/2003 |
| CN | 101662882 | 3/2010 |
| JP | 2001077541 | 3/2001 |

OTHER PUBLICATIONS

Kim, N., et al.; "Low Cost/Ultra High Density and High Performance Wirebond Package Design and SI/PI Analysis for FPGA with Embedded Dual Core ARM CPU and Dedicated DDR3 Memory Channel;" DesignCon 2012; pp. 1-22.

*Primary Examiner* — Xiaoliang Chen
(74) *Attorney, Agent, or Firm* — McClure, Qualey & Rodack, LLP

(57) ABSTRACT

A printed circuit board for mobile platforms includes a core substrate having a first side, a ground plane covering on the first side, a first insulating layer covering the ground plane, and a plurality of first signal traces and a plurality of first ground traces, alternatively arranged on the first insulating layer, a second insulating layer connecting to the first insulating layer, and a plurality of second signal traces separated from each other, disposed on the second insulating layer, wherein the second signal traces are disposed directly on spaces between the first signal traces and the first ground traces adjacent thereto, wherein coverage of the ground plane is corresponding to disposition of the first signal trace, the first ground trace, the second signal trace and the second ground trace.

11 Claims, 7 Drawing Sheets

Related U.S. Application Data

(60) Provisional application No. 61/623,164, filed on Apr. 12, 2012, provisional application No. 61/603,117, filed on Feb. 24, 2012.

(52) U.S. Cl.
CPC ........... H05K 1/0298 (2013.01); H05K 1/115 (2013.01); H05K 1/114 (2013.01); H05K 2201/0723 (2013.01); H05K 2201/09672 (2013.01); H05K 2201/09709 (2013.01); H05K 2201/10522 (2013.01); H05K 2201/10674 (2013.01)

(58) Field of Classification Search
CPC .......... H05K 1/0221; H05K 3/28; H05K 3/46; H05K 3/281; H01L 21/02; H01L 21/48; H01L 23/31; H01L 23/50; H01L 23/58; H01L 23/66
USPC ................. 174/250, 36, 251, 254, 255, 257, 174/260–264, 268; 361/777
See application file for complete search history.

(56) References Cited

U.S. PATENT DOCUMENTS

| | | | |
|---|---|---|---|
| 5,483,101 A | | 1/1996 | Shimoto et al. |
| 5,844,783 A | * | 12/1998 | Kojima ................ H05K 1/0219 174/261 |
| 6,040,524 A | * | 3/2000 | Kobayashi .......... H05K 1/0219 174/262 |
| 6,133,805 A | * | 10/2000 | Jain ........................ H01P 3/088 333/1 |
| 6,420,778 B1 | | 7/2002 | Sinyansky |
| 6,737,589 B2 | * | 5/2004 | Adachi .................. H05K 1/028 174/254 |
| 6,800,939 B2 | * | 10/2004 | Schaper ........... H01L 23/49838 174/261 |
| 8,344,257 B2 | * | 1/2013 | Wu ...................... H05K 1/0221 174/250 |
| 9,099,340 B2 | * | 8/2015 | Michael ................ H01L 23/50 |
| 2002/0180027 A1 | * | 12/2002 | Yamaguchi ........... H01L 21/486 257/700 |

* cited by examiner

… (1)

PRINTED CIRCUIT BOARD FOR MOBILE PLATFORMS

CROSS REFERENCE TO RELATED APPLICATIONS

This application is a Continuation of pending U.S. application Ser. No. 13/747,738, filed on Jan. 23, 2013, which claims the benefit of U.S. Provisional Application No. 61/603,117, filed on Feb. 24, 2012, and U.S. Provisional Application No. 61/623,164, filed on Apr. 12, 2012, the entireties of which are incorporated by reference herein.

BACKGROUND OF THE INVENTION

Field of the Invention

The present invention relates to a printed circuit board for a mobile platform, and in particular, to a routing arrangement of ground traces and signal traces of a printed circuit board for a mobile platform.

Description of the Related Art

Printed circuit boards (PCBs) are used to mechanically support and electrically connect electronic components using conductive pathways, conductive traces (e.g. signal traces or ground traces) etched from metal sheets laminated onto a non-conductive core substrate. For a semiconductor chip package design, an increased amount of input/output (I/O) connections for multi-functional or memory chips is required. The impact of this will be pressure on printed circuit board (PCB) fabricators to minimize the width and the space of the conductive traces, or increase the number of layers on the PCB. The increased amount of conductive traces needs to be arranged in different layer levels of the PCB. However, the conductive traces arranged in different layer levels of the PCB result in an impedance mismatch problem between the electronic components and the conductive traces in different layer levels, especially in high signal speed applications, for example, mobile platform applications. The impedance mismatch problem can detrimentally affect the shape of a signal traveling on a conductive trace, thereby affecting the signal reception of the electronic component supported by the PCB. Also, signal traces with small spaces therebetween can result in a crosstalk problem.

Thus, a novel printed circuit board for mobile platforms is desirable.

BRIEF SUMMARY OF THE INVENTION

A printed circuit board for mobile platforms is provided. An exemplary embodiment of a printed circuit board for mobile platforms comprises a core substrate having a first side. A ground plane covers the first side. A first insulating layer covers the ground plane. A plurality of first signal traces and a plurality of first ground traces are alternately arranged on the first insulating layer. A second insulating layer connects to the first insulating layer. A plurality of second signal traces separated from each other is disposed on the second insulating layer, wherein the second signal traces are disposed directly on spaces between the first signal traces and the first ground traces adjacent thereto.

Another exemplary embodiment of a printed circuit board for mobile platforms comprises a core substrate having a first side. A ground plane covers the first side. A first insulating layer covers the ground plane. A plurality of first signal traces and a plurality of first ground traces are alternatively arranged on the first insulating layer. A second insulating layer is disposed on the first insulating layer, covering the first signal traces and the first ground traces. A plurality of second signal traces and a plurality of second ground traces are alternatively arranged on the second insulating layer, wherein the first signal traces overlap with the second ground traces, and the first ground traces overlap with the second signal traces from the top view.

Yet another exemplary embodiment of a printed circuit board for mobile platforms comprises a core substrate having a first side. A ground plane covers on the first side. A first insulating layer covers the ground plane. A plurality of first signal traces and a plurality of first ground traces, are alternatively arranged on the first insulating layer. A second insulating layer is disposed on to the first insulating layer, covering the first signal traces and the first ground traces. A plurality of second signal traces separated from each other is disposed on the second insulating layer, wherein the second signal traces are overlap with the first ground traces.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
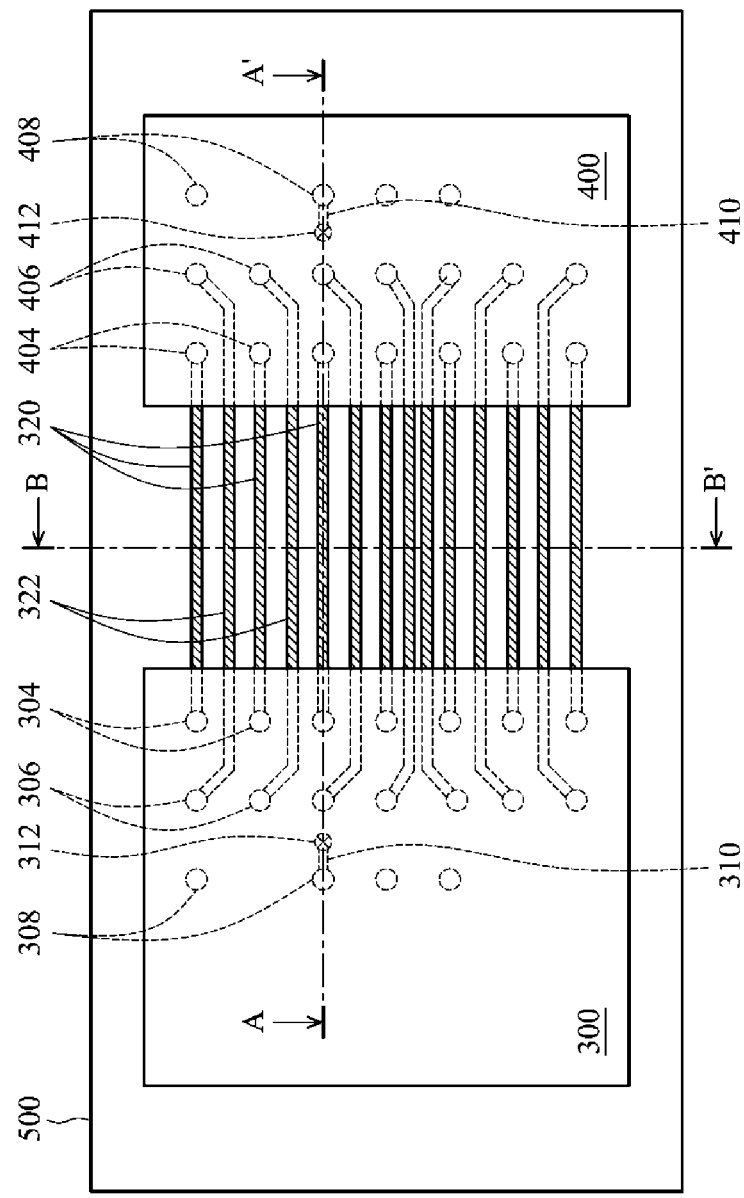
FIG. 1 is a top view of one exemplary embodiment of a printed circuit board (PCB) for mobile platforms with chips thereon of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1 is a top view of one exemplary embodiment of a printed circuit board (PCB) 500 for mobile platforms with chips 300 and 400 thereon of the invention. In one embodiment, the PCB 500 may comprise a six-layered PCB. Chips 300 and 400 using a flip chip technology bond on the PCB 500. As shown in FIG. 1, a first row of conductive bumps 304 of the chip 300 are usually designed to directly connect to a first row of conductive bumps 404 of the chip 400 by conductive traces 320 at a topmost layered level of the PCB 500. The first row of conductive bumps 304 of the chip 300 described herein is close to an edge of the chip 300 and also close to a space between the chips 300 and 400. Also, the first row of conductive bumps 404 of the chip 400 described herein is close to an edge of the chip 400 and also close to a space between the chips 300 and 400. Each of the spaces between the two close conductive bumps 304 of the chip 300 and the two close conductive bumps 404 of the chip 400 are wide enough to allow an additional conductive trace to pass therethrough. Therefore, a second row of conductive bumps 306 of the chip 300 may also directly connect to a second row of conductive bumps 406 of the chip 400 by conductive traces 322 at the topmost layered level of the PCB 500. However, there is no enough spaces allowing other conductive traces disposed at the topmost layered level of the PCB 500 to connect to a third row of conductive bumps 308 of the chip 300 and a third row of conductive bumps 408 of the chip 400. The conductive bumps 308 and the conductive bumps 408 may be designed to connect to conductive traces 324 at a middle layered level of the PCB 500 by vias 312 and 412.

Figure 3:
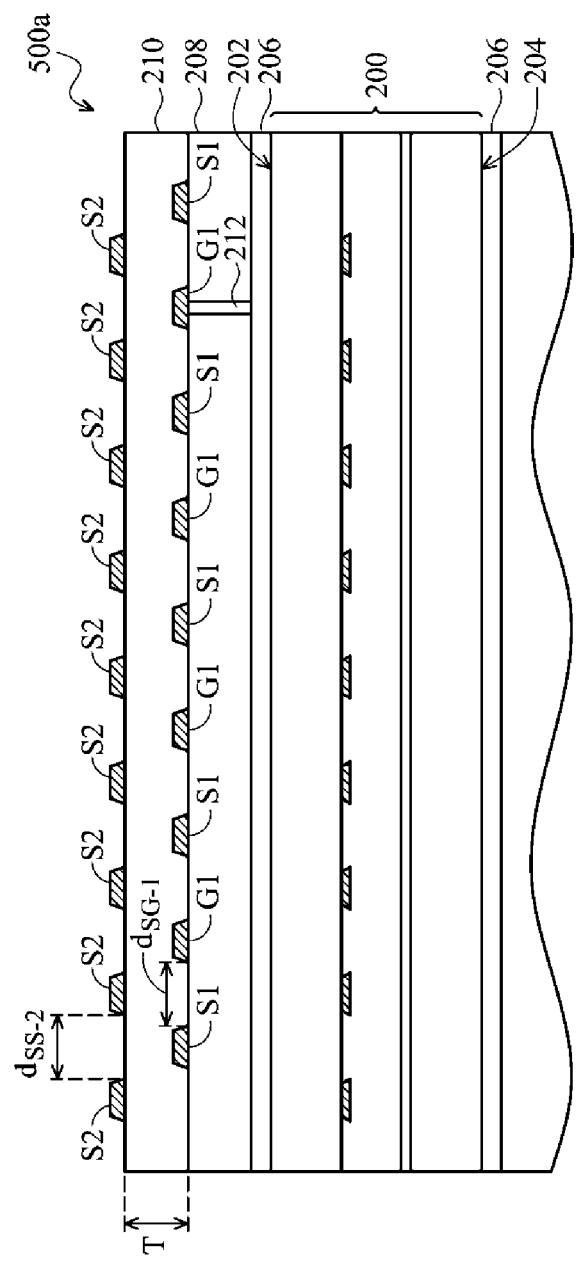
FIG. 3 is a cross section of one exemplary embodiment of a printed circuit board (PCB) for mobile platforms along line B-B' of FIG. 1.

To reduce the impedance difference between the conductive traces at the topmost layered level and the middle layered level, FIG. 3-7 provides cross sections of exemplary embodiments of a printed circuit board (PCB) 500a-500e for mobile platforms along line A-A' of FIG. 1. As shown in FIG. 3, the PCB 500a comprises a core substrate 200 having a first side 202 and a second side 204 opposite to the first side 202. In this embodiment, the PCB 500a has a symmetric structure and an interconnection structure on the first side 202 of the PCB 500a, which comprises insulating layers, a ground plane, signal traces and ground traces, the same as the interconnection structure on the second side 204 of the PCB 500a. Therefore, the interconnection structure on the second side 204 is omitted herein for brevity.

A ground plane 206 is disposed covering the first side 202. It is noted that the ground plane 206 is designed at the bottommost layered level of the PCB 500a. A first insulating layer 208 is disposed on the first side 202, covering the ground plane 206. In this embodiment, a plurality of first signal traces S1 and a plurality of first ground traces G1 alternatively arranged are disposed in the middle layered level of the PCB 500a. In other words, the first ground traces G1 are laterally separated from one another by the first signal traces S1. The first signal traces S1 and the first ground traces G1 are disposed on the first insulating layer 208. In one embodiment, the spaces between the first signal traces S1 and the first ground traces G1 close to each other may have the same value. Also, the spaces may be equal to widths of the first signal traces S1 and the first ground traces G1.

As shown in FIG. 3 again, a second insulating layer 210 is disposed on the first insulating layer 208, covering the first signal traces S1 and the first ground traces G1. In one embodiment, the first insulating layer 208 and the second insulating layer 210 may comprise the same material. In this embodiment, a plurality of second signal traces S2 separated from each other is disposed at the topmost layered level of the PCB 500a. The second signal traces S2 are also disposed on the second insulating layer 210. In this embodiment, the topmost layered level of the PCB 500a comprises the second signal traces S2 only. In other words, no ground signal traces are disposed on the topmost layered level of the PCB 500a. In this embodiment, the second signal traces S2 are respectively disposed directly on spaces between the first signal traces and the first ground traces adjacent thereto. In other words, the second signal traces S2 do not overlap with any of the first signal traces S1 or the first ground traces G1 from the top view. Also, a first lateral distance between the second signal trace S2 and the first ground trace G1 close thereto is designed to be equal to a second lateral distance between the second signal trace S2 and the first signal trace S1 close thereto.

An arrangement of the ground plane, the signal traces, and the ground traces (including the first signal trace S1, the first ground trace G1, and the second signal trace S2) is shown in FIG. 1, with the ground plane 206 designed at the bottommost layered level of the PCB 500a. Alternatively arranged first signal traces S1 and first ground traces G1 are disposed on the middle layered level of the PCB 500a. Therefore, the ground traces can easily connect to the ground plane at the bottommost layered level of the PCB 500a. For example, each of the first ground traces G1 of the PCB 500a is coupled to the ground plane 206 through at least one via 212 through the insulating layer 208. Also, the topmost layered level of the PCB 500a only comprises second signal traces S2. With a thickness T of the second insulating layer 210, the space $d_{SG-1}$ between the first signal trace S1 and the first ground trace G1 at the middle layered level of the PCB 500a, and the space $d_{SS-2}$ between the second signal trace S2 at the topmost layered level of the PCB 500a, are designed to have the same value. The vertical distance between the second signal trace S2 at the topmost layered level of the PCB 500a and the first ground trace G1 at the middle layered level of the PCB 500a may be easily designed to be almost the same as the lateral distance between the first signal trace S1 at the middle layered level of the PCB 500a and the first ground trace G1 at the middle layered level of the PCB 500a. Therefore, the difference of impedance of the signal traces at different levels of the PCB 500a may be reduced.

Figure 2:
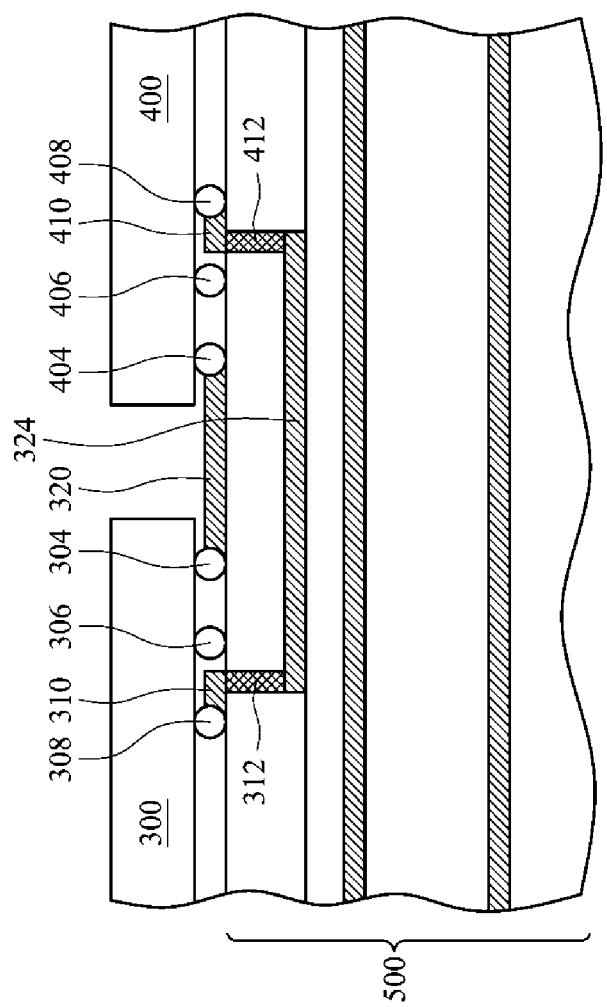
FIG. 2 is a cross section of one exemplary embodiment of a printed circuit board (PCB) for mobile platforms along line A-A' of FIG. 1.
Figure 4:
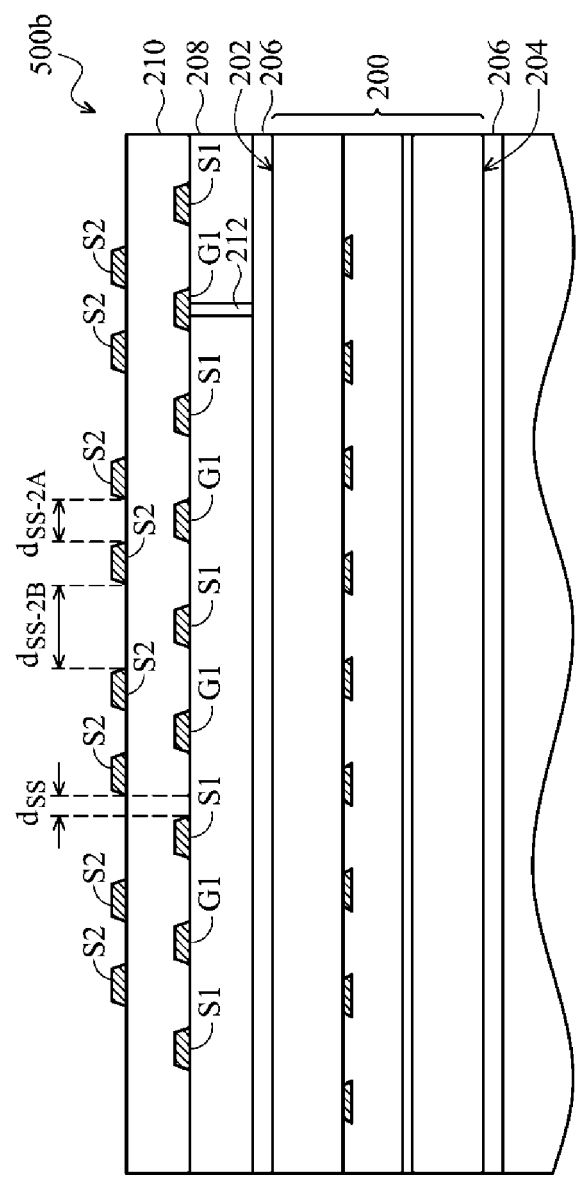
FIG. 4 is a cross section of another exemplary embodiment of a printed circuit board (PCB) for mobile platforms along line B-B' of FIG. 1.

FIG. 4 is cross section of another exemplary embodiment of a PCB 500b for mobile platforms along line B-B' of FIG. 1. For brevity, elements of the embodiments that are the same or similar to those previously described with reference to FIGS. 1-3, are not repeated hereinafter. In an arrangement of the ground plane, the signal traces, and the ground traces (including a ground plane 206, first signal trace S1, first ground trace G1, and second signal trace S2) as shown in FIG. 4, the ground plane 206 is disposed on the bottommost layered level of the PCB 500b. In an alternative arrangement, the first signal traces S1 and first ground traces G1 are disposed on the middle layered level of the PCB 500b. Therefore, the first ground traces G1 can easily connect to the ground plane at the bottommost layered level of the PCB 500b. For example, each of the first ground traces G1 of the PCB 500b is coupled to the ground plane 206 through at least one via 212 through the insulating layer 208. Also, the topmost layered level of the PCB 500b only comprises second signal traces S2. In other words, no ground signal traces are disposed on the topmost layered level of the PCB 500b. It is noted that the vertical distance between the second signal trace S2 at the topmost layered level of the PCB 500b and the first ground trace G1 at the middle layered level of the PCB 500b may be designed less than the lateral distance $d_{SS}$ between the first signal trace S1 at the middle layered level of the PCB 500b and the first ground trace G1 at the middle layered level of the PCB 500b. For example, distances $d_{SS-2A}$ and $d_{SS-2b}$ between the two adjacent second signal traces have at least two values. Therefore, a signal coupling effect between the first and second signal traces (S1, S2) at the topmost layered level and the middle layered level of the PCB 500a can be reduced. A crosstalk problem between the signal traces (S1, S2) at the topmost layered level and the middle layered level of the PCB 500b can also be reduced.

Figure 5:
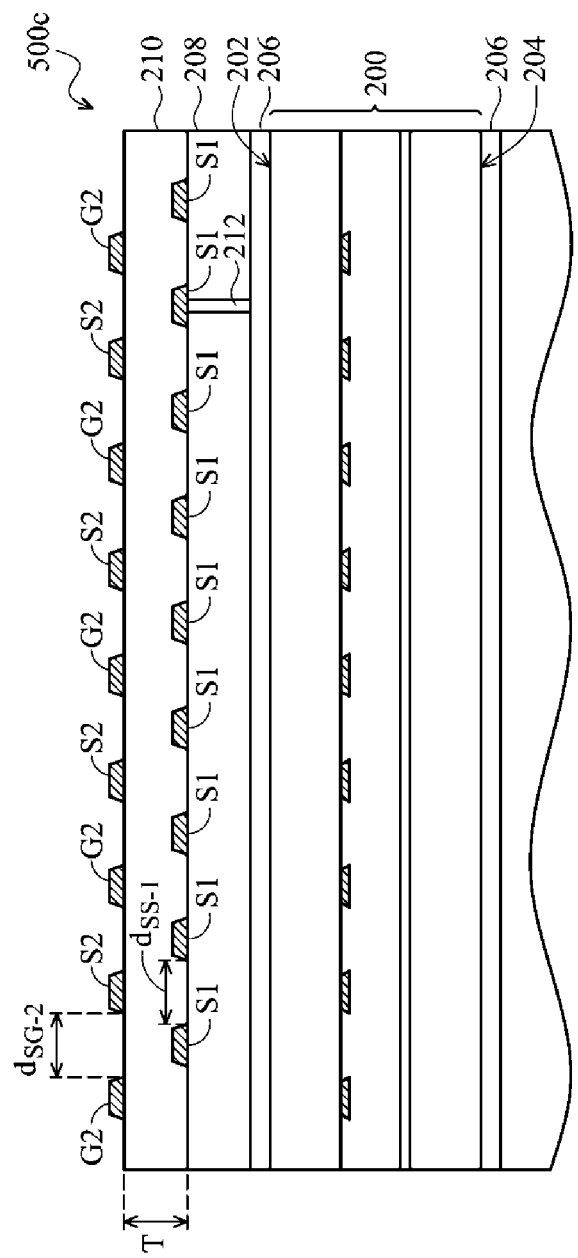
FIG. 5 is a cross section of yet another exemplary embodiment of a printed circuit board (PCB) for mobile platforms along line B-B' of FIG. 1.

FIG. 5 is cross section of yet another exemplary embodiment of a PCB 500c for mobile platforms along line B-B' of FIG. 1. Elements of the embodiments hereinafter that are the same or similar as those previously described with reference to FIGS. 1-4 are not repeated for brevity. In an arrangement of the ground plane, the signal traces and the ground traces (including a ground plane 206, first signal traces S1, second ground traces G2, and second signal traces S2) as shown in FIG. 5, a ground plane 206 is disposed on the bottommost layered level of the PCB 500c. In this embodiment, a middle layered level of the PCB 500b only comprises signal traces S2. Therefore, the signal traces S2 can easily connect to the ground plane at the bottommost layered level of the PCB 500c. Also, alternatively arranged second signal traces S2 and second ground traces G2 are disposed on the topmost layered level of the PCB 500c. In this embodiment, no via through the first insulating layer 208 is used to connect the second ground traces G2 and the ground plane 206 of the PCB 500c. In this embodiment, each of the second ground traces G2 may be designed to couple to the ground plane 206 at the bottommost layered level of the PCB 500c through at least one via and at least one electrical component or at least one conductive pad. For example, each of the second ground traces G2 may be designed to couple to a ground pad at the topmost layered level of the PCB 500c, where the ground pad is disposed in a position with a lower conductive trace density. Also, the ground pad may be coupled to the ground plane 206 at the bottommost layered level of the PCB 500c by vias passing through the first insulating layer 208 and the second insulating layer 210. Alternatively, each of the second ground traces G2 may be designed to couple to a capacitor disposed on the PCB 500c. Usually, the capacitor is designed in a position with a lower conductive trace density. Therefore, the capacitor may be coupled to the ground of the PCB 500c. Given the thickness T of the second insulating layer 210, the space $d_{SS-1}$ between the first signal trace S1 at the middle layered level of the PCB 500c, and the space $d_{SG-2}$ between the second signal trace S2 and the second ground trace G2 at the topmost layered level of the PCB 500c are designed have the same value. The vertical distance between the second ground trace G2 at the topmost layered level of the PCB 500c and the first signal trace S1 at the middle layered level of the PCB 500c may be easily designed to be almost the same as the lateral distance between the second signal trace S2 and the second ground trace G2 at the topmost layered level of the PCB 500c. Therefore, the impedance difference of the signal traces at different level of the PCB 500c may be reduced.

Figure 6:
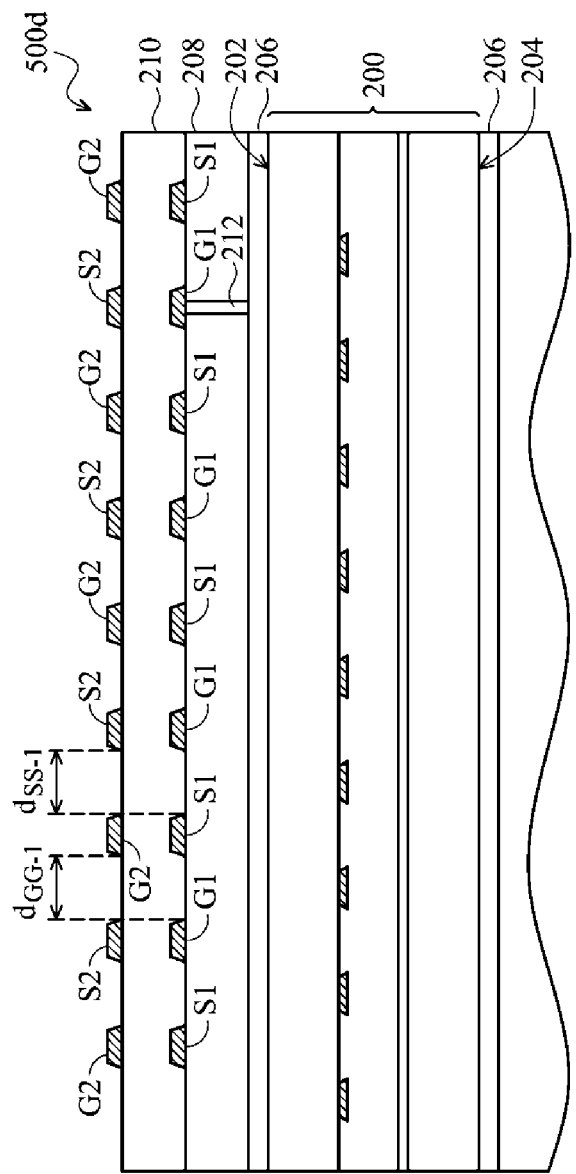
FIG. 6 is a cross section of still another exemplary embodiment of a printed circuit board (PCB) for mobile platforms along line B-B' of FIG. 1.

FIG. 6 is cross section of still another exemplary embodiment of a PCB 500d for mobile platforms along line B-B' of FIG. 1. Elements of the embodiments hereinafter, that are the same or similar to those previously described with reference to FIGS. 1-5, are not repeated for brevity. In an arrangement of the ground plane, the signal traces and the ground traces (including a ground plane 206, first signal trace S1, first ground trace G1, and the second signal trace S2) as shown in FIG. 6, the ground plane 206 is designed to be on the bottommost layered level of the PCB 500d. Alternatively arranged, first signal traces S1 and first ground traces G1 are designed to be in the middle layered level of the PCB 500d. Therefore, the first ground traces G1 can easily connect to the ground plane on the bottommost layered level of the PCB 500d. For example, each of the first ground traces G1 of the PCB 500d is coupled to the ground plane 206 through at least one via 212 through the insulating layer 208. Also, a plurality of second signal traces S2 and a plurality of second ground traces G2 are alternatively arranged on the second insulating layer 210. The alternatively arranged second signal traces S2 and second ground traces G2 are designed to be on the topmost layered level of the PCB 500d. In this embodiment, the first signal traces S1 respectively overlap (or fully overlap) with the second ground traces G2, and the first ground traces G1 respectively overlap (or fully overlap) with the second signal traces S2, from the top view. For example, the second ground traces G2 are directly over the first signal traces S1, and the second signal traces S2 are directly over the first ground traces G1. In this embodiment, a first lateral distance $d_{GG-1}$ between the second ground trace G2 and the first ground trace G1 close thereto is equal to a second lateral distance $d_{SS-1}$ between the second signal trace S2 and the first signal trace S1 close thereto. In this embodiment, each of the second ground traces G2 may be designed to couple to the ground plane 206 through at least one via and at least one electrical component or at least one conductive pad. For example, each of the second ground traces G2 may be designed to couple to a ground pad at the topmost layered level of the PCB 500d, the ground pad is designed to be in a position with a lower conductive trace density. Also, the ground pad may be coupled to the ground plane 206 at the bottommost layered level of the PCB 500d by vias passing through the first insulating layer 208 and the second insulating layer 210. Alternatively, each of the second ground traces G2 may be designed to couple to a capacitor disposed on the PCB 500d. Usually, the capacitor is designed to be in a position with a lower conductive trace density. Therefore, the capacitor may be coupled to the ground of the PCB 500d. Therefore, second signal traces S2 may be designed to couple to the first ground traces G1 at the middle layered level of the PCB 500d or the second ground traces G2 at the topmost layered level of the PCB 500d.

Figure 7:
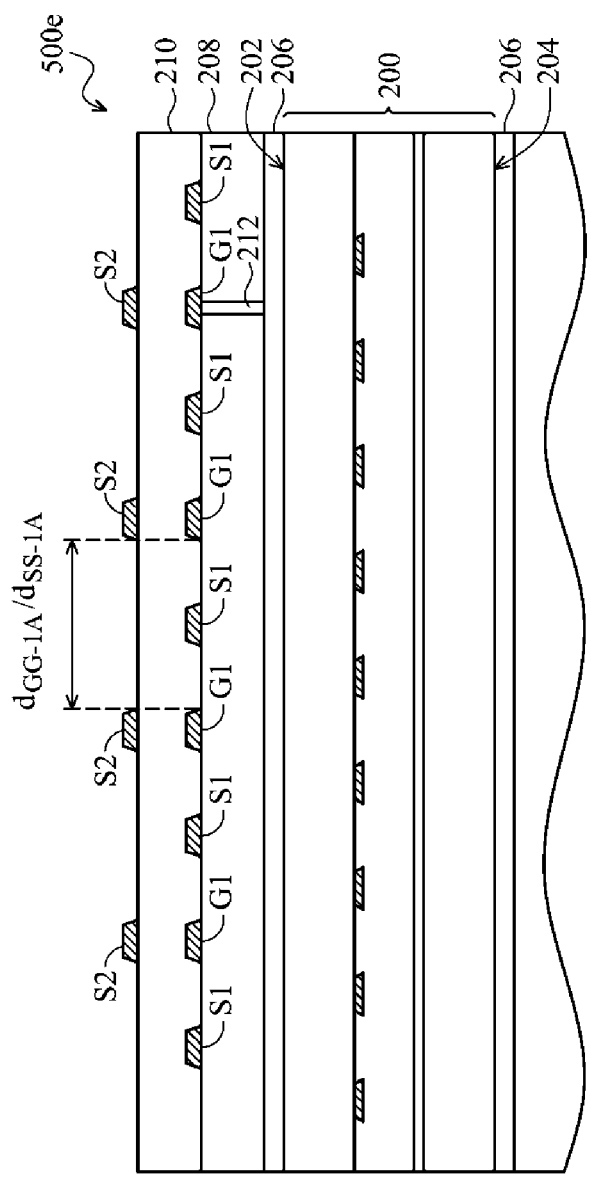
FIG. 7 is a cross section of still yet another exemplary embodiment of a printed circuit board (PCB) for mobile platforms along line B-B' of FIG. 1.

Moreover, a number of the signal traces at the topmost layered level of the PCB may be designed the same to that of the ground traces at the middle layered level of the PCB. Also, the signal traces at the topmost layered level of the PCB may be designed respectively overlap with the ground traces at the middle layered level of the PCB. FIG. 7 is cross section of still yet another exemplary embodiment of a PCB 500e for mobile platforms along line B-B' of FIG. 1. Elements of the embodiments hereinafter, that are the same or similar to those previously described with reference to FIGS. 1-6, are not repeated for brevity. In an arrangement of the ground plane, the signal traces and the ground traces (including a ground plane 206, first signal trace S1, first ground trace G1, and the second signal trace S2) as shown in FIG. 7, the ground plane 206 is designed to be on the bottommost layered level of the PCB 500e. Alternatively arranged, first signal traces S1 and first ground traces G1 are designed to be in the middle layered level of the PCB 500e. Therefore, the first ground traces G1 can easily connect to the ground plane on the bottommost layered level of the PCB 500e. For example, each of the first ground traces G1 of the PCB 500e is coupled to the ground plane 206 through at least one via 212 through the insulating layer 208. In this embodiment, a plurality of second signal traces S2 separated from each other is disposed at the topmost layered level of the PCB 500e. The second signal traces S2 are also disposed on the second insulating layer 210. In this embodiment, the topmost layered level of the PCB 500e comprises the second signal traces S2 only. In other words, no ground signal traces are disposed on the topmost layered level of the PCB 500e. In this embodiment, the first ground traces G1 respectively overlap (or fully overlap) with the second signal traces S2, from the top view. For example, each of the second signal traces S2 is designed directly over the corresponding first ground trace G1. In this embodiment, a first lateral distance $d_{GG-1A}$ between the two adjacent first ground traces G1 is designed equal to a second lateral distance $d_{SS-1A}$ between the two adjacent second signal traces S2. Therefore, the first ground traces G1 and the second signal traces S2 may have the same pitch. Also, a number of the second signal traces S2 at the topmost layered level of the PCB may be designed the same to that of the first ground traces G1 at the middle layered level of the PCB. The vertical distance between the second signal trace S2 at the topmost layered level and the first ground trace G1 at the middle layered level of the PCB 500e may be easily designed to be almost the same as the lateral distance between the first signal trace S1 and the first ground trace G1 close thereto at the middle layered level of the PCB 500e. Accordingly, the impedance difference of the signal traces at different level of the PCB 500e may be reduced.

Embodiments provide a printed circuit board (PCB) for mobile platforms. The impedance mismatch problem between the electronic components and the conductive traces in different layer levels on the PCB can be reduced by interleaving a ground trace with two signal traces close to each other at a middle or topmost layered level of the PCB. In one embodiment, the topmost layered level of the PCB can be designed for the signal trace routing only. Also, distances between the signal traces at the topmost layered level and the ground traces at the middle layered level of the PCB can be designed to be the same as those of the signal traces at the middle layered level and the ground traces at the middle layered level of the PCB to reduce the impedance mismatch problem. Further, the lateral distance between the signal traces at the topmost layered level and the ground traces at the middle layered level of the PCB can be designed to be less than the lateral distance between the signal traces at the topmost layered level and the signal traces at the middle layered level of the PCB, to reduce the crosstalk problem. In another embodiment, the middle layered level of the PCB can be designed for signal trace routing only. Also, distances between the signal traces at the middle layered level and the ground traces at the topmost layered level of the PCB can be controlled in the same way as the signal traces and the ground traces at the topmost layered level of the PCB to reduce the impedance mismatch problem.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board for mobile platforms, comprising:

a core substrate having a first side and an opposing second side;
a first ground plane layer covering the first side;
a first insulating layer covering the ground plane layer;
a plurality of first signal traces and a plurality of first ground traces, alternately arranged on the first insulating layer;
a second insulating layer connecting to the first insulating layer;
a plurality of second signal traces separated from each other, disposed on the second insulating layer, wherein the second signal traces are disposed directly over spaces between the first signal traces and the first ground traces adjacent thereto, wherein coverage of the ground plane layer corresponds to disposition of the first signal traces, the first ground traces, and the second signal traces;
a second ground plane layer covering the second side of the core substrate;
a third insulating layer covering the second ground plane layer;
a plurality of third signal traces and a plurality of third ground traces, alternately arranged on the third insulating layer;
a fourth insulating layer connecting to the third insulating layer; and
a plurality of fourth signal traces separated from each other, disposed on the fourth insulating layer, wherein the fourth signal traces are disposed directly over spaces between the third signal traces and the third ground traces adjacent thereto, wherein coverage of the second ground plane layer corresponds to disposition of the third signal traces, the third ground traces, and the fourth signal traces.

2. The printed circuit board for mobile platforms as claimed in claim 1, wherein the second insulating layer covers the first signal traces and the first ground traces, and wherein the first signal traces and the first ground traces are disposed at a middle layered level of the printed circuit board between the first ground plane layer and a level containing the second signal traces.

3. The printed circuit board for mobile platforms as claimed in claim 1, wherein the first ground traces are laterally separated from one another by the first signal traces.

4. The printed circuit board for mobile platforms as claimed in claim 1, wherein the second signal traces do not overlap with any of the first signal traces or the first ground traces from a top view.

5. The printed circuit board for mobile platforms as claimed in claim 1, wherein a first lateral distance between the second signal trace and the first ground trace close thereto is equal to a second lateral distance between the second signal trace and the first signal trace close thereto.

6. The printed circuit board for mobile platforms as claimed in claim 1, wherein a first lateral distance between the second signal trace and the first ground trace close thereto is less than a second lateral distance between the second signal trace and the first signal trace close thereto.

7. The printed circuit board for mobile platforms as claimed in claim 6, wherein the spaces between the two adjacent second signal traces have at least two values.

8. The printed circuit board for mobile platforms as claimed in claim 7, wherein one of the spaces between the two adjacent second signal traces is equal to the width of the first ground trace.

9. The printed circuit board for mobile platforms as claimed in claim 2, wherein each of the first ground traces is coupled to the ground plane through at least one via.

10. The printed circuit board for mobile platforms as claimed in claim 8, wherein each of the first ground traces is coupled to the ground plane through at least one via and at least one electrical component or at least one conductive pad.

11. The printed circuit board for mobile platforms as claimed in claim 1, wherein each of the second ground traces is coupled to the ground plane through at least one via and at least one electrical component or at least one conductive pad.

* * * * *